United States Patent
Nishimura et al.

(10) Patent No.: US 6,858,829 B2
(45) Date of Patent: Feb. 22, 2005

(54) AVALANCHE PHOTODIODE ARRAY BIASING DEVICE AND AVALANCHE PHOTODIODE STRUCTURE

(75) Inventors: Ken A. Nishimura, Fremont, CA (US); Brian E. Lemoff, Union City, CA (US); James N. Hollenhorst, Saratoga, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 593 days.

(21) Appl. No.: 09/885,906

(22) Filed: Jun. 20, 2001

(65) Prior Publication Data

US 2002/0195545 A1 Dec. 26, 2002

(51) Int. Cl.⁷ .............................. H01J 40/14
(52) U.S. Cl. .................. 250/214 R; 327/514
(58) Field of Search .................. 250/214 R, 214.1, 250/214 AG; 327/513, 514

(56) References Cited

U.S. PATENT DOCUMENTS

| | | | |
|---|---|---|---|
| 4,236,069 A | * 11/1980 | Laughlin | 250/214 AG |
| 4,730,128 A | 3/1988 | Seki | 307/310 |
| 4,933,731 A | 6/1990 | Kimura | 357/30 |
| 5,578,815 A | * 11/1996 | Nakase et al. | 250/214 R |
| 5,596,186 A | 1/1997 | Kobayashi | 250/214.1 |
| 6,157,022 A | 12/2000 | Maeda et al. | 250/214 |

FOREIGN PATENT DOCUMENTS

| | | | |
|---|---|---|---|
| JP | 54163290 | 12/1979 | |
| JP | 61255829 | 10/1986 | |
| JP | 62061000 | 3/1987 | 3/30 |
| JP | 63171758 | 12/1988 | 31/10 |
| JP | 01278898 | 10/1989 | 31/10 |
| JP | 08245373 | 9/1996 | 31/107 |

* cited by examiner

*Primary Examiner*—Stephone B. Allen

(57) ABSTRACT

A photodiode array includes a plurality of arrayed individual diode devices. The arrayed diode devices include at least one active photodiode and at least one reference diode. A bias control circuit for the array monitors operation of the reference diode at an applied first bias voltage and adjusts that applied first bias voltage until optimal reference diode operation is reached. A second bias voltage having predetermined relationship to the first bias voltage is applied to the active photodiode to optimally configure array operation. More specifically, an operational characteristic of the reference diode at the first bias voltage is monitored and compared to a reference value. As a result of this comparison, the circuit adjusts the applied first and second bias voltage in order to drive the reference diode measured characteristic to substantially match the reference value. The operational characteristic that is measured may comprise reference diode responsivity or reference diode output current, and may be based on either electrical or optical device operation. Each avalanche photodiode semiconductor structure may have a conventional reverse biased pn junction semiconductor structure providing a high field region as is well known in the art. An enhanced semiconductor structure may also be utilized wherein a heavily doped layer that is physically separate from the pn junction is also included to provide a source of charge carriers that are swept into the high field region.

20 Claims, 5 Drawing Sheets

AVALANCHE PHOTODIODE ARRAY BIASING DEVICE AND AVALANCHE PHOTODIODE STRUCTURE

BACKGROUND OF THE INVENTION

1. Technical Field of the Invention

The present invention relates to avalanche photodiodes and, in particular, to arrays of avalanche photodiodes.

2. Description of Related Art

An avalanche photodiode (APD) is a semiconductor photosensor device capable of light detection. It is especially useful in low, weak or reduced light applications as the avalanche phenomenon utilized by the device provides for a significant degree of amplification. Avalanche occurs when carriers generated by photon induced free carrier generation in a light receiving area of the device are introduced into a high electric field area formed in a highly reverse biased (near breakdown voltage) semiconductor pn junction. The introduced carriers collide with neutral atoms to release other carriers by impact ionization. This collision process is then repeated and repeated in an avalanche fashion to effectively amplify the limited number of carriers that were initially produced by photon induced free carrier generation. It is well known that the amplification factor (i.e., gain or responsivity) of an avalanche photodiode is heavily dependent on the applied reverse bias.

FIG. 1 illustrates in cross-section a conventional semiconductor avalanche photodiode device 10. The device includes a p silicon substrate layer 12. On that substrate layer 12 is formed an intrinsic (p−) layer 14 which constitutes the light (hv) receiving layer and which may, for example, comprise an epitaxial growth layer. A p layer 16 is then formed on the intrinsic layer 14 through, for example, boron diffusion. An n+ layer 18 is then formed in the p layer 16 through, for example, phosphorus diffusion. An electrode (perhaps aluminum) 20 is provided to contact the n+ layer 18. Another electrode (also perhaps aluminum) 22 is provided for the p silicon substrate layer 12. The electrodes 20 and 22 comprise the contact terminals for the photodiode device 10, and it is between these electrodes that a reverse bias voltage is applied. Individual photodiode devices 10 may be assembled together in an n×m array format to form an avalanche photodiode array 24 as illustrated in FIG. 2 wherein each of the devices share a common, single monolithic substrate.

A limiting factor in the use of avalanche photodiode devices is the careful control that must be exercised over the electric field generated by the applied reverse bias. The gain of the avalanche photodiode device is a function of that applied electric field. It is important that the electric field be established at an optimal level so that the device gain is neither too high nor too low. Unfortunately, the device gain value cannot be easily measured. It is, however, recognized by those skilled in the art that the responsivity of the avalanche photodiode device can be measured and that measuring responsivity substitutes as a proxy for measuring gain. Thus, by effectuating some measure of control over device responsivity, one can to some degree control gain. A primary reason one desires to control gain is to minimize system noise. In an optical receiver using an avalanche photodiode, there is an certain optimal gain where overall system noise for the receiver is minimized. If the gain is too low, the noise of the preamplifier used to convert the avalanche photodiode output signal to a useable level will dominate. Conversely, if the gain is too high, the output of the avalanche photodiode device may become saturated by either dark current or incident light, or become dominated by excess noise generation.

SUMMARY OF THE INVENTION

An embodiment of the invention comprises a photodiode array including a plurality of arrayed individual diode devices. The arrayed diode devices include at least one active photodiode and at least one reference diode. The arrayed diode devices are preferably matched to each other through fabrication on a single monolithic semiconductor substrate.

An embodiment of the invention still further comprises a bias control circuit for the foregoing photodiode array. The bias control circuit monitors operation of the reference diode and adjusts a first bias voltage applied to the reference diode until optimal reference diode operation is reached. A second bias voltage having a predetermined relationship to the first bias voltage is then applied to the at least one active photodiode and configures the array in an optimal operating condition.

Another embodiment of the invention still further comprises a method for selecting the first and second bias voltages in the manner executed by the foregoing bias control circuit.

More specifically, the bias control circuit of the invention measures an operational characteristic of at least one reference diode for comparison to a reference value and adjusts a first bias voltage value applied to the reference diode in order to drive the reference diode's measured operational characteristic to substantially match the reference value. A second bias voltage having a predetermined relationship to the first bias voltage is then applied to the active photodiode to optimally configure operation of the array. The operational characteristic that is measured may comprise reference diode responsivity, reference diode output current or any other suitable dynamic operating characteristic of the device. In each case, the operational characteristic measurement may be based on either electrical or optical device operation.

An embodiment of the invention still further comprises an avalanche photodiode semiconductor structure useful for the reference diode comprising a high field pn junction and a means for injecting charge carriers to be swept into the high field region. More specifically, the structure includes a substrate layer, a source of charge carriers, an intrinsic layer, and an overlaying pn junction layer. An electrode contacts the source of charge carriers and receives an input current that causes release of charge carriers to be avalanche multiplied by the high field region and generate an output current. The relationship between the input and output currents may then be monitored to provide information indicative of photodiode responsivity.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF EMBODIMENTS OF THE INVENTION

Figure 1:
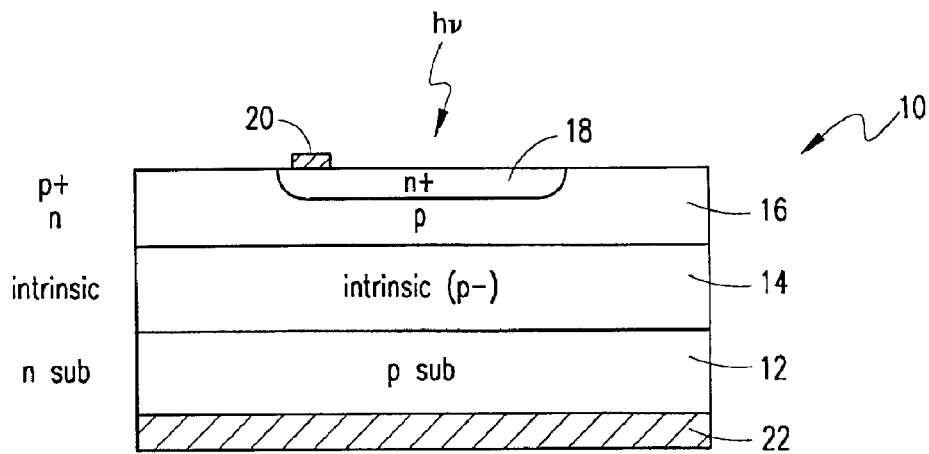
FIG. 1, previously described, is a cross-sectional view of a conventional semiconductor avalanche photodiode device.
Figure 2:
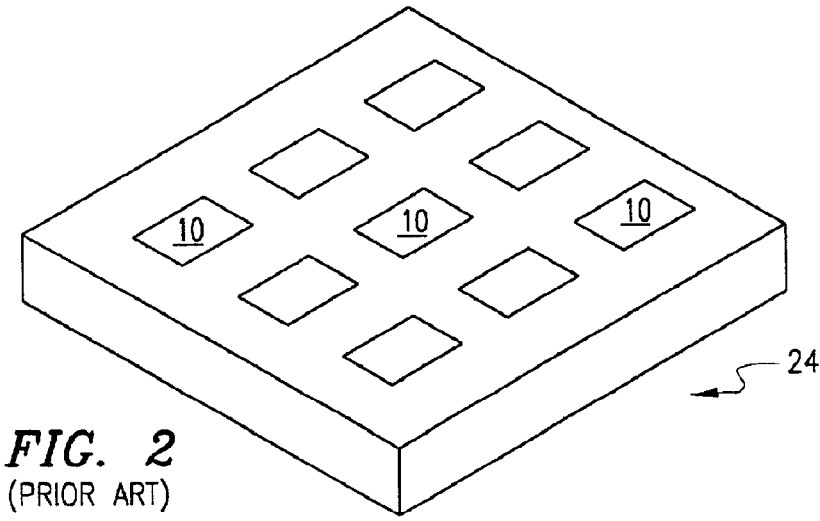
FIG. 2, previously described, is a perspective view of an avalanche photodiode array.
Figure 3:
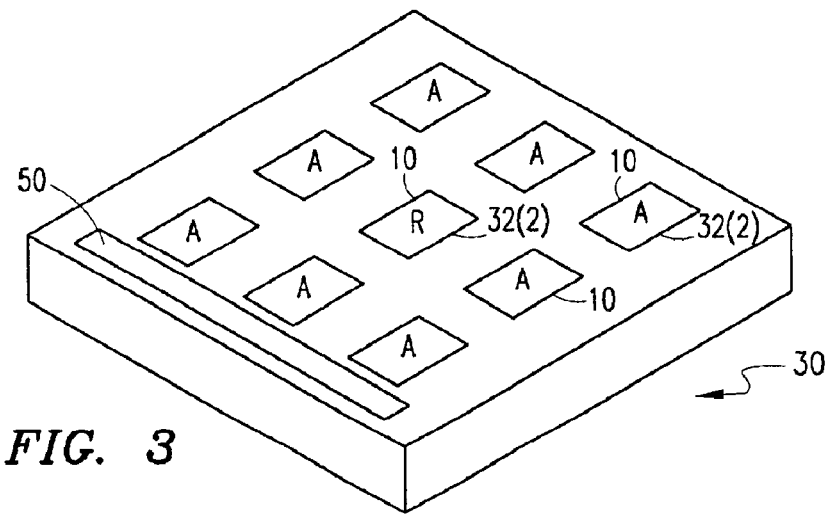
FIG. 3 is a perspective view of an avalanche photodiode array.

FIG. 3 is a perspective view of an avalanche photodiode array 30 in accordance with an embodiment of the invention. The array 30 includes a plurality of diode devices 32 that may be of any known type including the type illustrated in FIG. 1 (and/or also the type shown in FIGS. 9A–9C to be discussed). These included devices 32 may be classified into two groups: a first group of devices 32(1) (designated with an "A") which comprise active photodiodes for the array 30; and a second group of devices 32(2) (designated "R") which comprise reference diodes for the array. In this context, the phrase "active photodiodes" as disclosed and claimed refers to those included photodiode devices 32(1) that are used to actively measure and/or detect light and to output signals indicative of that light for processing in connection with the operation of the array 30 in a certain user application. The phrase "reference diodes," on the other hand, as disclosed and claimed refers to those included diode devices 32(2) that are used primarily, but not necessarily exclusively, in a manner to be described for measuring operational characteristics of the devices 32.

By fabricating both the devices 32(1) and the devices 32(2) on a common single monolithic substrate, the characteristics of all the devices 32 included in the array 30 are matched. The reason for this is that all of the devices 32 (active and reference) included in the array 30 are subjected to nominally identical environmental conditions during manufacture (i.e., semiconductor fabrication), and will be subjected to nominally identical environmental conditions (temperature, and the like) during use. It can accordingly be expected that the behavior of any one or more of the included reference diode devices 32(2) is similar to and representative of the behavior for each of the active photodiode devices 32(1). This property of matching with respect to the included devices 32 is exploited by the embodiments of the invention to determine and apply an optimal bias.

Figure 4:
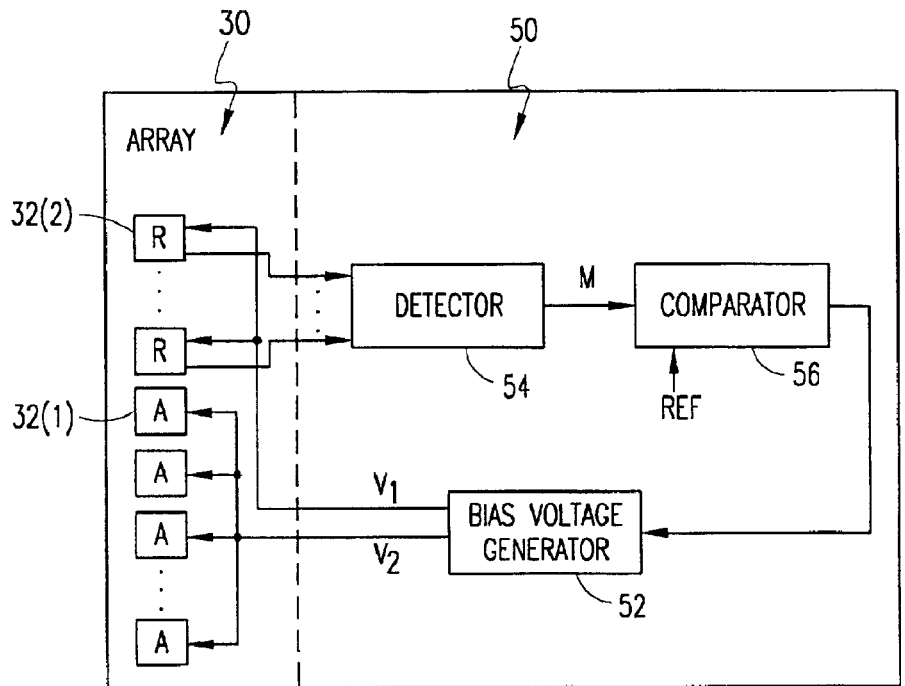
FIG. 4 is a schematic diagram of a bias control circuit in accordance with an embodiment of the invention.

FIG. 4 is a schematic diagram of a bias control circuit 50 in accordance with an embodiment of the invention. The circuit 50 operates, generally speaking, in the manner of a servo loop. Each included reference diode device 32(2) is applied with a first (reverse) bias voltage (V1) output from a bias voltage generator 52. A detector 54 is connected to one or more of the reference diode device(s) 32(2) to measure an operational characteristic value of the device (such as responsivity, or other dynamic operational factors—like current—that are related to gain) on an individual or average basis. The measured operational characteristic value is then compared by a comparator 56 against a desired reference. The resulting difference is then used by the bias voltage generator 52 to adjust the applied first bias voltage (V1) and drive the measured reference diode device 32(2) operational characteristic value substantially to a matching condition with the desired reference value. The bias voltage generator 52 farther outputs a second (reverse) bias voltage (V2), having a predetermined relationship with the first bias voltage (V1), for application to each of the active photodiode devices 32(1). Application of the first and second bias voltages to the devices 32 in the foregoing manner places the array 30 in an optimal operational condition.

In an embodiment of the invention, the bias control circuit 50 is fabricated along with the array 30 on a common monolithic semiconductor substrate to form a combined circuit 58 (see, also, FIG. 3). It will, of course, be understood that the circuit 50 may alternatively be implemented separately (i.e., on a different substrate) from the array 30 (as generally indicated by dotted line 60).

The predetermined relationship maintained by the bias voltage generator 52 with respect to the first bias voltage (V1) and the second bias voltage (V2) may be established in any of a number of ways. For example, the relationship may be one of equality wherein V2=V1. Alternatively, the relationship may be a proportional (for example, scaled) relationship wherein V2=nV1 and n is any suitable predetermined scaling value. Still further the relationship may be an additive relationship wherein V2=V1+C and C is any suitable predetermined positive or negative value. The bias voltage generator 52 accordingly further includes any necessary circuitry or functionality for generating the first and second bias voltages. It is further recognized, but not explicitly illustrated, that separate bias voltage generators may be used with their operation coordinated in order to generate the first and second bias voltages. It is still further understood that in the case where the first and second bias voltages are equal that a common bias application voltage connection may be used to connect the bias voltage generator to the devices 32.

Figure 5:
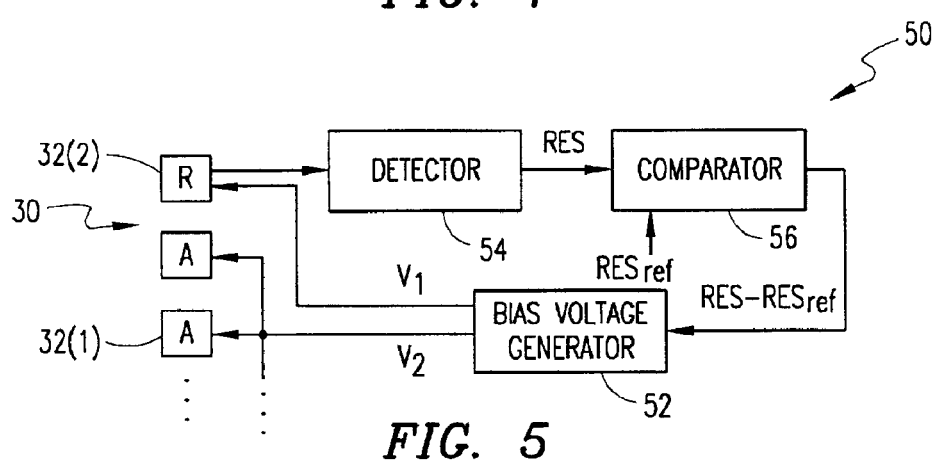
FIG. 5 is a schematic diagram of one embodiment of the bias control circuit.

Another embodiment of the bias control circuit 50 is shown in FIG. 5. Each included reference diode device 32(2) is applied with a first bias voltage (V1) output from the bias voltage generator 52. The detector 54 measures reference diode device 32(2) responsivity (RES) on an individual or average basis using techniques that are well known to those skilled in the art. The measured responsivity RES is then compared by comparator 56 against a desired reference responsivity (RESref). The resulting difference (RES-RESref) is then used by the bias voltage generator 52 to adjust the applied first bias voltage (V1) output and drive the measured reference diode device 32(2) responsivity substantially to a matching condition with the desired reference responsivity. The bias voltage generator 52 further outputs a second bias voltage (V2), having a predetermined relationship with the first bias voltage (V1), for application to each of the active photodiode devices 32(1) and placement of the array 30 in an optimal operational condition.

Figure 6A:
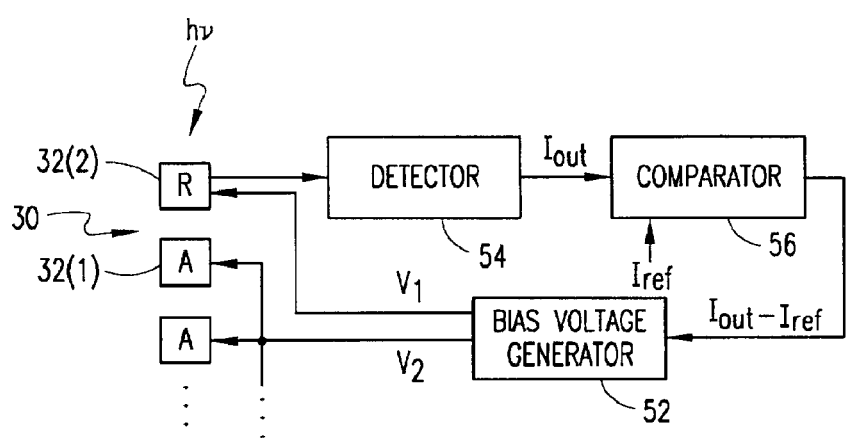
FIGS. 6A and 6B are schematic diagrams of alternative embodiments of the bias control circuit.

FIG. 6A is a schematic diagram of another embodiment of the bias control circuit in accordance with the invention. In this implementation, a known intensity of light (hv) is applied to the reference diode device(s) 32(2). The detector 54 then operates to measure the output current (Iout) from the reference diode device(s). The measured output current in this case is known to be proportional to device responsivity due to the fact that it is generated as a result of a known intensity of applied light. The comparator 56 accordingly operates to compare the measured Iout value against a reference current Iref. The servo loop then operates to adjust the first bias voltage (V1) output and drive the measured reference diode device 32(2) output current Iout substantially to a matching condition with the desired reference current Iref. Put another way, the circuit 50 operates to adjust the first bias voltage V1 to result in a certain constant output current for a predetermined intensity constant light input. The bias voltage generator 52 further outputs a second bias voltage (V2), having a predetermined relationship with the first bias voltage (V1), for application to each of the active photodiode devices 32(1) and placement of the array 30 in an optimal operational condition.

Figure 6B:
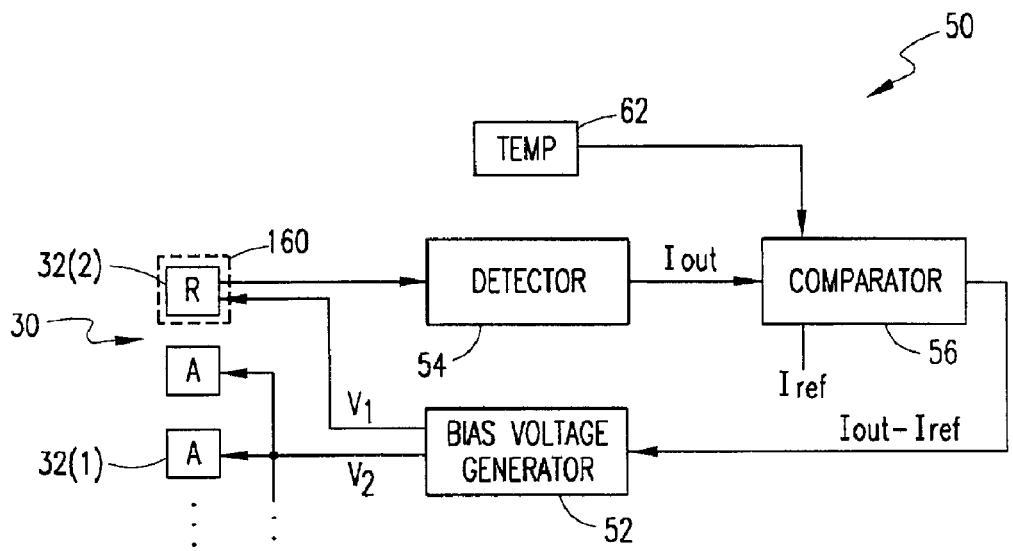

Although the foregoing operation is recognized as being highly robust, one noted drawback is that it suffers from the need for a light source to illuminate the reference device(s) 32(2) with a predetermined intensity of light. Given this drawback, a variant of the foregoing operation is to utilize dark current in lieu of the incident light. Dark current refers to an output current Iout that is generated by the reference diode device 32(2) in the absence of light (generally designated in FIG. 6B by a dashed line which indicates a light tight enclosure 160 surrounding the reference diode 32(2)). A disadvantage of this choice is that the dark current value varies strongly as a function of device temperature. This introduces an additional state variable that must be measured and accounted for in the servo loop. This can be accomplished by including a temperature sensor 62 in the circuit 50 that is thermally coupled to the array 30. The comparator 56 then accounts for the measured temperature of the array 30 when comparing the dark current value against the reference current. More specifically, the comparator 56 accounts for the measured temperature in making the current comparison by adjusting the reference current according to a predetermined function using the measured array temperature as an input, wherein it is recognized that the magnitude of dark current is roughly exponential with changes in temperature.

Figure 7A:
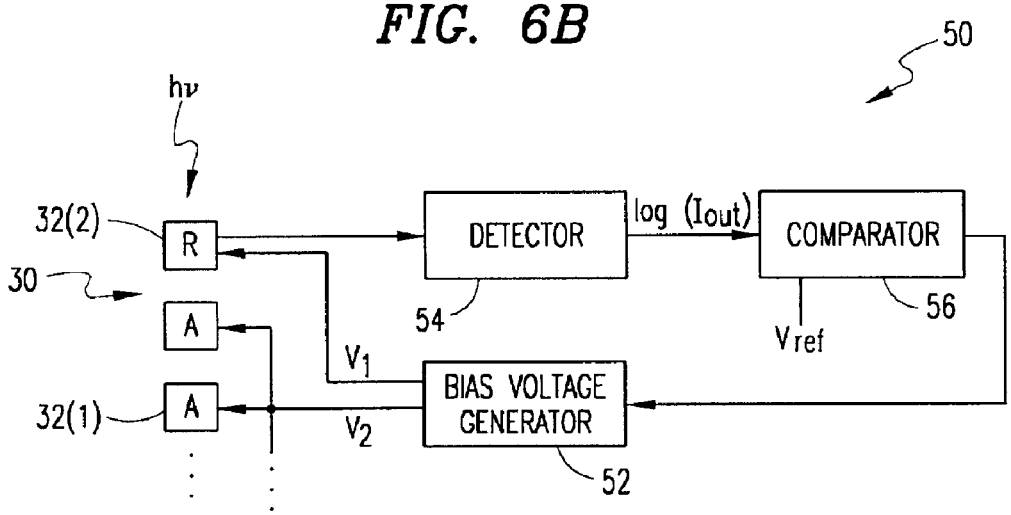
FIGS. 7A and 7B are schematic diagrams of alternative embodiments of the bias control circuit.

It is known in the art to generate a family of curves defining photodiode device operation wherein each of the curves plots, for a given intensity of applied light, log(Iout) as a function of the applied bias voltage. A well known property of avalanche photodiode devices is that the slope of these curves for a given responsivity is fairly independent of the applied light. FIG. 7A is a schematic diagram of another embodiment of the bias control circuit 50 that takes advantage of this constant slope property by using the detector 54 to measure the log(Iout) value. The detected value is then compared against a reference (for example, a reference voltage), with the comparison result adjusting the first bias voltage (V1) output to drive the measured reference diode device 32(2) output current Iout substantially to a matching condition with the desired reference. The bias voltage generator 52 further outputs a second bias voltage (V2), having a predetermined relationship with the first bias voltage (V1), for application to each of the active photodiode devices 32(1) and placement of the array 30 in an optimal operational condition.

Figure 7B:
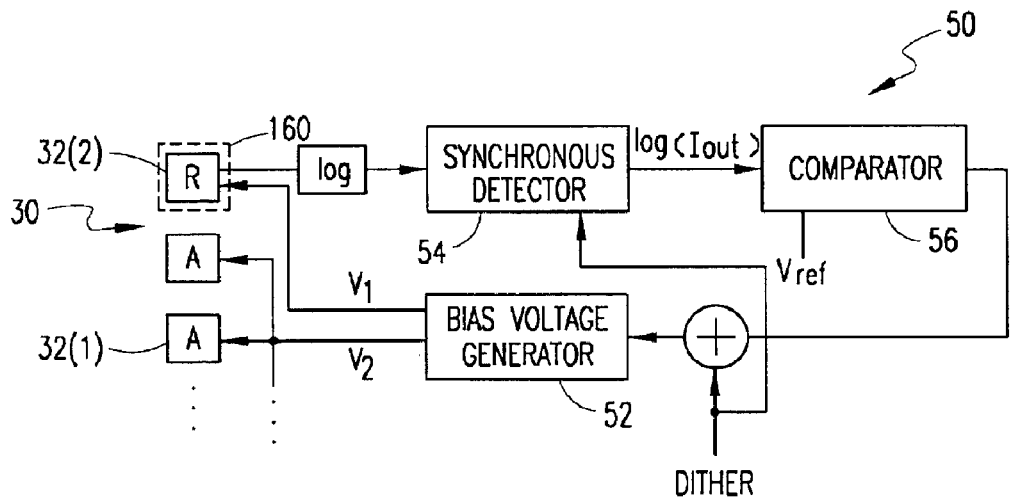

It is noted that dark current (see, reference 160, and also the prior description of FIG. 6B) may be used for the log(Iout) measurement as shown in FIG. 7B. It may be necessary in this configuration for the detector 54 to operate in a synchronous detection mode as shown under the control of an applied dither signal. An advantage of synchronous operation as shown in FIG. 7B is that it allows the reference diode to also function as an active diode. Thus, although not explicitly illustrated, it will be understood that synchronous operation may be implemented in connection with the embodiments shown in FIGS. 6A and 7A to facilitate efficient use of the devices 32 in both active and reference operations.

Figure 8:
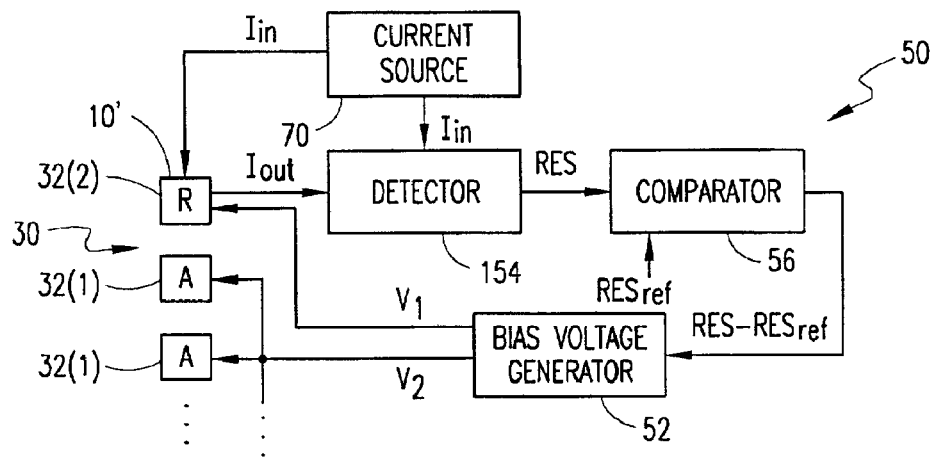
FIG. 8 is a schematic diagram of another embodiment of the bias control circuit.

FIG. 8 is a schematic diagram of another embodiment of the bias control circuit. In this implementation, a current source 70 generates an input current (Iin) that produces a predetermined number of charge carriers to be swept into the high field region (pn junction) of the reference diode device (s) 32(2). The detector 154 then measures the reference device output current (Iout) that results from the injection of those charge carriers, and compares the current Iin to that output current Iout. In this configuration, the quotient of these two values represents the responsivity (RES) of the reference diode device 32(2). The measured responsivity RES is then compared by the comparator 56 against a desired reference responsivity (RESref). The resulting difference (RES-RESref) is then used by the bias voltage generator 52 to adjust the applied first bias voltage (V1) and drive the measured reference diode device 32(2) responsivity RES substantially to a matching condition with the desired reference responsivity RESref. The bias voltage generator 52 further outputs a second bias voltage (V2), having a predetermined relationship with the first bias voltage (V1), for application to each of the active photodiode devices 32(1) and placement of the array 30 in an optimal operational condition.

Figure 9A:
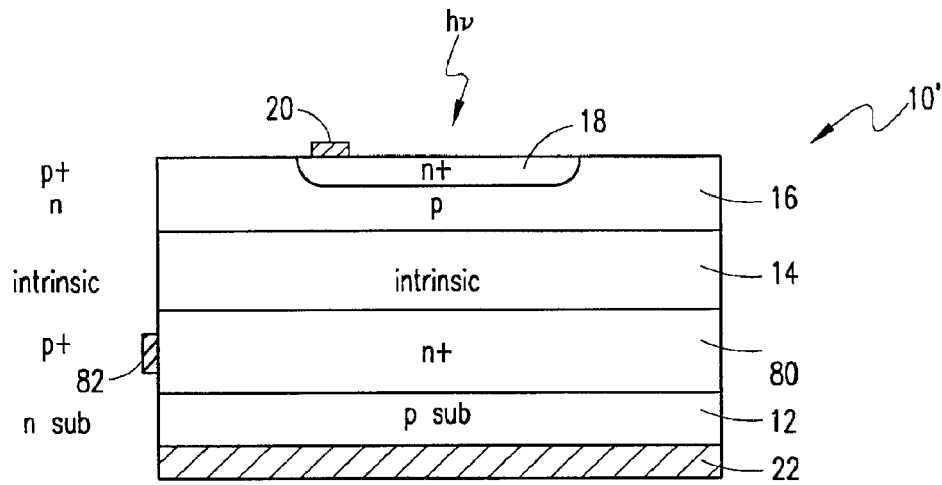
FIGS. 9A–9C are cross-sectional views of a semiconductor avalanche photodiode device in accordance with several embodiments of the invention.
Figure 9B:
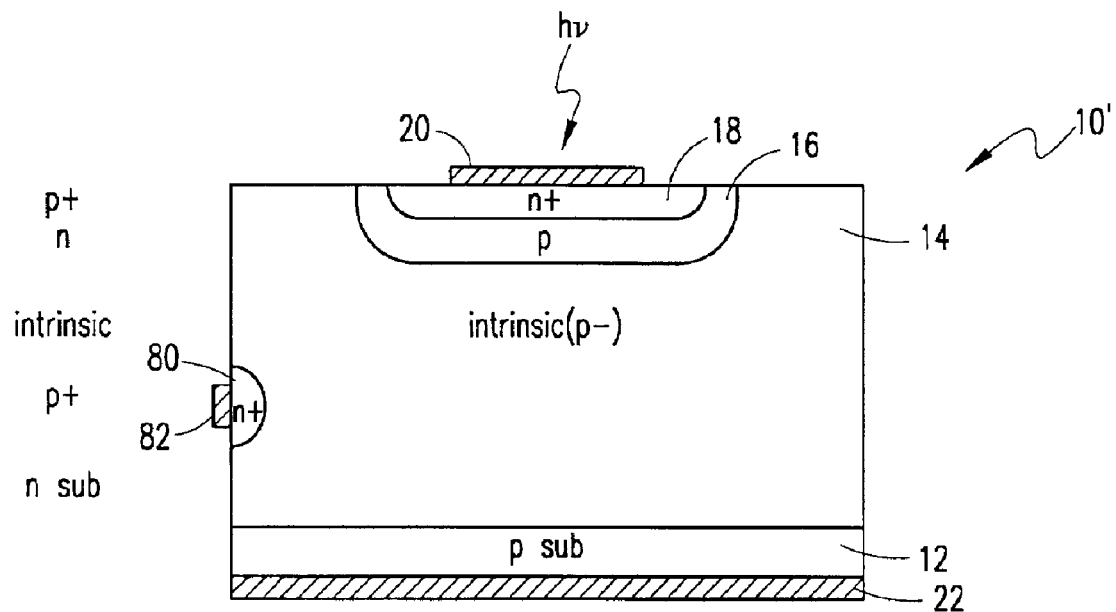
Figure 9C:
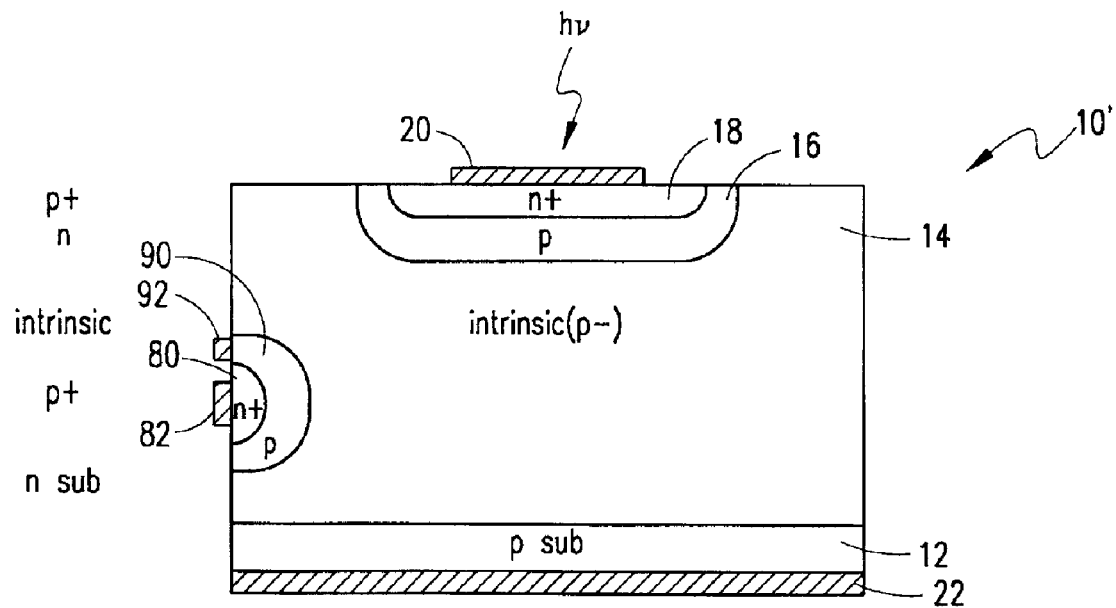

To accomplish the charge carrier injection required for operation of the bias control circuit of FIG. 8, the prior art avalanche photodiode device 10 (see, FIG. 1) structure must be modified. This modification is illustrated in FIGS. 9A–9C wherein there are shown in cross-section several embodiments of a semiconductor avalanche photodiode device 10'. In each of the FIGS. 9A–9C, identical reference numbers with respect to the device 10 of FIG. 1 refer to identical components or features and further description of those components and features is not provided.

Figure 10:
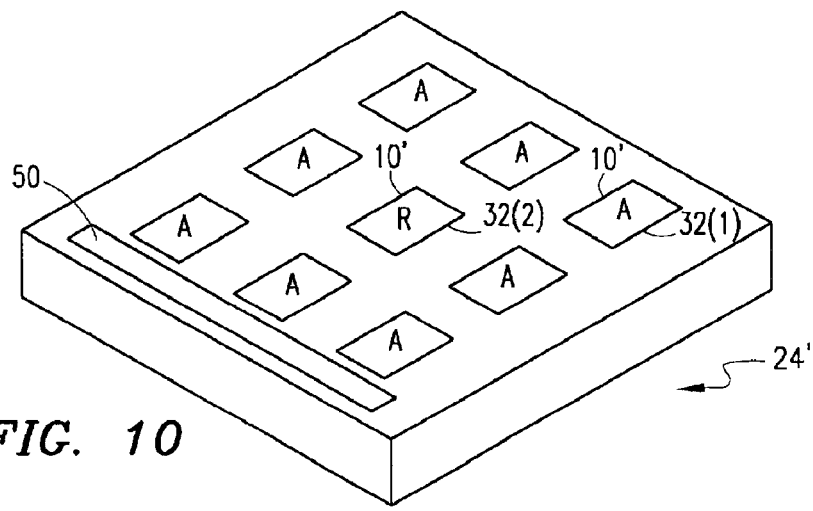
FIG. 10 is a perspective view of an avalanche photodiode array using the photodiode device of FIGS. 9A–9C.

In FIG. 9A, a heavily doped n+ region 80 is formed over the silicon substrate layer 12. Doping of this region 80 may be accomplished in any suitable well known manner, for example, using phosphorus atoms with a concentration on the order of $1 \times 10^{19}$ cm$^{-3}$. The intrinsic (p–) layer 14 is then formed over the region 80. An additional electrode (also perhaps aluminum) 82 is provided to contact the n+ region 80. Although the electrode 82 is illustrated in a side-mount configuration, it will be understood that other methods for making contact with the n+ region 80 (such as top mount through an insulated via) may be used. It is through this electrode 82 that the predetermined current Iin is applied, with the heavily doped region 80 acting as a source of charge carriers (electrons in the primary illustration) that are injected into the high field region of the device 10' formed at the pn junction proportionally in response (and proportional) to the magnitude of the applied input current. Individual photodiode devices 10' may be assembled together in an n×m array format to form an avalanche photodiode array 24' as illustrated in FIG. 10 wherein each of the devices share a common, single monolithic substrate. This substrate may also be shared with the circuit 50 implemented in the manner shown in FIG. 8. In FIG. 9B, the structure of FIG. 9A has been slightly modified to instead use an n+ injector region 80' located within the intrinsic layer 14. In either FIG. 9A or 9B, if a known current is conducted through the electrode 82, electrons (charge carriers) will be injected into the intrinsic layer. The existing field in the device, as provided by the bias voltage applied between terminals 20 and 22, will sweep the injected electrons into the high field region created at the pn junction. If that field is sufficient to induce avalanche multiplication, the current represented by the injected electrons will be multiplied. By measuring the ratio of currents representing the injected electrons at electrode 82, and the multiplied output current at terminal 20, a measure of avalanche multiplication (i.e., responsiveness) may be obtained.

In FIG. 9C, the structure of FIG. 9B has been slightly modified to include an additional p region 90 that is placed between the injector region 80' and the intrinsic layer 14. In FIG. 9B, the local potential of the intrinsic layer 14 that is located near (i.e., immediately adjacent) the injecting region 80' is not well controlled and is a function of the applied bias between terminals 20 and 22. It is this bias, however, that the various embodiments of the present invention desire to control. The additional region 92 assists in mitigating the possibility that photodiode bias adjustment (as performed herein in connection with the operation of circuit 50) will adversely interact with the injected current. An additional electrode 92 is provided to contact the region 90 to form a structure where the potential across the pn junction formed by the injector region 80' and the additional region 90 can be adjusted by changing the potential difference between two ohmic contacts (82 and 92). If the additional region 90 is made thin enough, the injected electrons from the region 80' will diffuse across the additional region 90 with negligible recombination and then drift into the high field region formed by the biased pn junction of layers 16 and 18. In this configuration, when computing the ratio of currents as described above, it is necessary to subtract any current applied to terminal 92 from the current that is applied to the terminal 82 before the ratio is computed. The reason for this is because the current applied at terminal 92 represents reverse injected holes do not contribute to the avalanche process.

It is recognized that the photodiode device of FIGS. 1 and 9A–9C can be made of any number of semiconductors, including compound semiconductors. For each semiconductor there is a preferred carrier type (electron or hole) that is used for carrier multiplication. In silicon, as illustrated in FIGS. 1 and 9A–9C, it is electrons. In indium phosphide (InP), on the other hand, it is holes. It should be recognized by those skilled in the art that the primary illustration of a silicon/electron configuration as in FIGS. 1 and 9A–9C is exemplary and that the various embodiments of the invention may equally be practiced in a semiconductor/holes configuration by using the appropriate semiconductor for the substrate and inverting the sense of the n-type and p-types layers and regions that are illustrated. Appropriate hole-based n/p type sense designations are provided for each layer/region in the margins of FIGS. 1 and 9A–9C.

It is further recognized that the array 30 need not be monolithic. In such a configuration, the array may be manufactured from separate photodiode and reference diode devices that are assembled together. Furthermore, the devices 32 of the array may manufactured together and then subsequently physically separated and assembled to form the array.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the invention as set forth and defined by the following claims.

We claim:

1. A biasing circuit for an avalanche photodiode having at least one associated reference diode, the biasing circuit comprising:
a bias voltage generator having a first output for applying a first bias voltage to the at least one reference diode and a second output for applying a second bias voltage to the avalanche photodiode, the second bias voltage having a predetermined relationship with the first bias voltage;
a detector having an input connected to the at least one reference diode to measure an operational characteristic thereof in response to the first bias voltage; and
a comparator that compares the measured operational characteristic to a reference value and that controls the bias voltage generator to adjust the first bias voltage and the second bias voltage in a manner that drives the measured operational characteristic to substantially match the reference value.

2. The biasing circuit as in claim 1 wherein the predetermined relationship between the first bias voltage and the second bias voltage is equality.

3. The biasing circuit of claim 1 wherein the biasing circuit, reference diode and avalanche photodiode are fabricated in the same semiconductor substrate.

4. The biasing circuit as in claim 1 wherein the operational characteristic comprises a reference diode responsivity at the applied first bias voltage.

5. The biasing circuit as in claim 4 wherein the reference diode responsively is measured for a known intensity of light incident on the at least one reference diode.

6. The biasing circuit as in claim 5 wherein the reference diode responsivity is measured in the absence of incident light on the at least one reference diode.

7. The biasing circuit as in claim 1 wherein:
the at least one reference diode provides an output current; and
the detector measures the output current of the at least one reference photodiode at the applied first bias voltage.

8. The biasing circuit as in claim 7 wherein the detector measures the output current at one of (a) a known intensity and (b) zero intensity of light incident on the at least one reference diode.

9. The biasing circuit as in claim 7 wherein the detector determines a derivative of the logarithm of the output current, and wherein the comparator compares the obtained derivative of the logarithm of the output current to a reference.

10. The biasing circuit as in claim 7 wherein the reference diode includes:
a high field region; and
means for injecting charge carriers to be swept into the high field region to generate the reference diode output current.

11. The biasing circuit as in claim 10 further including:
a current generator for applying a predetermined input current to the means for injecting charge carriers;
and wherein:
the detector operates to determine a relationship between the reference diode output current and the input current and thereby obtain a value indicative of responsivity of the at least one reference diode;
the reference value comprises a reference responsivity; and
the comparator operates to compare the value indicative of responsivity to the reference responsivity.

12. A method for biasing an avalanche photodiode having an associated reference diode, comprising the steps of:
generating a first bias voltage for application to the reference diode;
generating a second bias voltage for application to the avalanche photodiode, the second bias voltage having a predetermined relationship with the first bias voltage;

measuring an operational characteristic of the reference diode in response to application of the first bias voltage;

comparing the measured operational characteristic to a referenced value; and adjusting the first bias voltage and second bias voltage in a manner that drives the measured operational characteristic to substantially match the reference value.

13. The method as in claim 12 wherein the predetermined relationship between the first and second bias voltages is equality.

14. The method as in claim 12 further including the step of applying a known intensity of light incident on the reference diode, and wherein the step of measuring the reference diode responsivity is measured for that known intensity of light.

15. The method as in claim 12 wherein the operational characteristic comprises a reference diode responsivity at the applied first bias voltage.

16. The method as in claim 15 wherein the reference diode responsivity is measured in the absence of incident light on the at least one reference photodiode.

17. The method as in claim 12 further including the step of generating an output current from the reference diode and wherein the step of measuring comprises the step measuring the output current at the applied first bias voltage.

18. The method as in claim 17 wherein the output current is measured at one of (a) a known intensity and (b) zero intensity of light incident on the reference diode.

19. The method as in claim 17 further comprising the steps of:

applying a predetermined input current to the matched reference diode;

injecting charge carriers proportional to the predetermined input current to be swept into a high field region of the reference diode to generate the diode output current; and determining a relationship between the output current and the input current to obtain a value indicative of the responsivity of the reference diode;

wherein the reference value comprises a reference responsivity, and wherein the step of comparing compares the obtained value indicative of the responsivity to the reference responsivity.

20. The method as in claim 17 further including the step of:

determining a derivative of the logarithm of the output current, and wherein the step of comparing compares the obtained derivative of the logarithm of the output current to a reference.

* * * * *